(12) United States Patent
Loopstra et al.

(10) Patent No.: US 8,373,846 B2
(45) Date of Patent: Feb. 12, 2013

(54) RADIATION SOURCE, LITHOGRAPHIC APPARATUS AND DEVICE MANUFACTURING METHOD

(75) Inventors: Erik Roelof Loopstra, Eindhoven (NL); Gerardus Hubertus Petrus Maria Swinkels, Eindhoven (NL); Vadim Yevgenyevich Banine, Deurne (NL); Johannes Hubertus Josephina Moors, Helmond (NL)

(73) Assignee: ASML Netherlands B.V., Veldhoven (NL)

(*) Notice: Subject to any disclaimer, the term of this patent is extended or adjusted under 35 U.S.C. 154(b) by 621 days.

(21) Appl. No.: 12/553,368

(22) Filed: Sep. 3, 2009

(65) Prior Publication Data

US 2010/0053576 A1    Mar. 4, 2010

Related U.S. Application Data

(60) Provisional application No. 61/136,428, filed on Sep. 4, 2008, provisional application No. 61/136,451, filed on Sep. 5, 2008, provisional application No. 61/193,814, filed on Dec. 24, 2008.

(51) Int. Cl.
*G03B 27/54* (2006.01)
*G03B 27/42* (2006.01)

(52) U.S. Cl. .......... 355/67; 355/53
(58) Field of Classification Search .......... 355/53, 355/67; 250/504 R, 492.1
See application file for complete search history.

(56) References Cited

U.S. PATENT DOCUMENTS

| | | | |
|---|---|---|---|
| 6,359,969 B1 | 3/2002 | Shmaenok | |
| 6,614,505 B2 | 9/2003 | Koster et al. | |
| 2008/0210889 A1* | 9/2008 | Suganuma et al. | 250/504 R |
| 2008/0267816 A1* | 10/2008 | Ueno et al. | 422/24 |
| 2010/0045948 A1* | 2/2010 | Kraus et al. | 355/30 |

FOREIGN PATENT DOCUMENTS
EP    1 394 612 B1    10/2008

* cited by examiner

*Primary Examiner* — Peter B Kim
(74) *Attorney, Agent, or Firm* — Pillsbury Winthrop Shaw Pittman LLP (57) ABSTRACT

A radiation source is configured to produce extreme ultraviolet radiation. The radiation source includes a chamber in which, in use, a plasma is generated, and an evaporation surface configured to evaporate a material formed as a by-product from the plasma and that is emitted to the evaporation surface. A method for removing a by-product material in or from a plasma radiation source of a lithographic apparatus includes evaporating a material which, in use, is emitted to that surface from the plasma.

20 Claims, 6 Drawing Sheets

RADIATION SOURCE, LITHOGRAPHIC APPARATUS AND DEVICE MANUFACTURING METHOD

CROSS-REFERENCE TO RELATED APPLICATIONS

This application claims the benefit of priority from U.S. Provisional Patent Application Ser. No. 61/136,428, filed on Sep. 4, 2008, U.S. Provisional Patent Application Ser. No. 61/136,451, filed on Sep. 5, 2008, and U.S. Provisional Patent Application Ser. No. 61/193,814, filed on Dec. 24, 2008, the contents of all of which are incorporated herein by reference in their entireties.

FIELD

The present invention relates to a lithographic apparatus and a method for producing extreme ultraviolet radiation.

BACKGROUND

A lithographic apparatus is a machine that applies a desired pattern onto a substrate, usually onto a target portion of the substrate. A lithographic apparatus can be used, for example, in the manufacture of integrated circuits (ICs). In that example, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in several ways: by shortening the exposure wavelength $\lambda$, by increasing the numerical aperture $NA_{PS}$, and/or by decreasing the value of $k_1$.

In order to shorten the exposure wavelength and, thus, reduce the minimum printable size, it has been proposed to use an extreme ultraviolet (EUV) radiation source. EUV radiation sources are configured to output a radiation wavelength of about 13 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings.

The source of EUV radiation is typically a plasma source, for example a laser-produced plasma or a discharge source. When using a plasma source, contamination particles are created as a by-product of the EUV radiation. Generally, such contamination particles are undesired, because they may inflict damage on parts of the lithographic apparatus, most notably mirrors which are located in a vicinity of the plasma source.

SUMMARY

It is desirable to mitigate the damage inflicted by the contamination particles. In an embodiment of the invention, there is provided a radiation source configured to produce extreme ultraviolet radiation, the radiation source comprising a chamber in which, in use, a plasma is generated, and an evaporation surface configured to evaporate a material formed as a by-product from the plasma that is emitted.

According to an embodiment of the invention, there is provided a radiation source, the radiation source being configured to produce extreme ultraviolet radiation, the radiation source comprising a chamber in which, in use, a plasma is generated, a collector mirror configured to focus radiation emitted by the plasma to a focal point, and a heating system and an evaporation surface, the heating system constructed and arranged to maintain the evaporation surface at a surface temperature, such that a pressure in a direct vicinity of the surface is below a vapor pressure for the surface temperature, the vapor pressure being the vapor pressure of a material which, in use, is emitted by the plasma as a by-product. The radiation source is, for instance, a discharge-produced plasma source or a laser-produced plasma source. The collector mirror may be a normal-incidence collector mirror.

According to another embodiment of the invention, there is provided a radiation source configured to produce extreme ultraviolet radiation, the radiation source including a chamber in which, in use, a plasma is generated and an evaporation surface configured to evaporate a material formed as a by-product from the plasma and that is emitted to the evaporation surface. Typically, the material may consist of micro-particles having a diameter in the range of 0.01-5 microns.

The radiation source may be configured to produce extreme ultraviolet radiation, the radiation source further including a gas injector arranged to inject a gas flow into the chamber at an edge of the evaporation surface. Desirably, the radiation source is a laser produced plasma source or a discharge-produced plasma source. The chamber may contain hydrogen.

In an embodiment of the invention, the evaporation surface is located at a location in a direction relative to the plasma, the direction being a direction in which more of the material is emitted than in the other directions.

In an embodiment, the radiation source may further include a fuel material supply constructed and arranged to supply a fuel material and a laser source arranged to irradiate the fuel material to generate the plasma. Usually, the material emitted as the by-product includes the fuel material or is the fuel material.

In an embodiment, the pressure of the material emitted as the by-product may be selected from the range of about 1 Pa to about 100 kPa. Also optionally, the temperature of the evaporation surface may be selected from the range of about 1475 K to about 2900 K.

In an embodiment, the surface may comprise one or more materials selected from the group consisting of Mo, W, and Re. Additionally or alternatively, the evaporation surface may, at least partially, be a rough surface. The evaporation surface may have a root mean square roughness of between 10 nm and about 1 mm, desirably between about 50 nm and about 10 μm.

The radiation source may include an outlet constructed and arranged to divert material evaporated by the evaporation surface. Such an outlet may further be connected to a pump constructed and arranged to divert material evaporated by the evaporation surface.

The radiation source may include a body having an inner wall and an outer wall. The inner wall may include a low-emissivity material. The outer wall may include a high-emissivity material. The body may be conically-shaped.

According to an embodiment there is provided a method for removing a by-product material in or from a plasma radiation source of a lithographic apparatus, the method comprising: evaporating a material which, in use, is emitted to an evaporation surface from the plasma.

According to an embodiment of the invention, there is provided a method for removing a by-product material in or from a plasma radiation source of a lithographic apparatus, the method comprising using a heating system and an evaporation surface, the heating system being constructed and arranged to maintain the evaporation surface at a surface temperature, wherein a pressure in a direct vicinity of the surface is below a vapor pressure for the surface temperature, the vapor pressure being the vapor pressure of the by-product material.

According to an embodiment of the invention, there is provided a method for removing a material emitted as a by-product in or by a plasma radiation source, the method comprising maintaining an evaporation surface at a surface temperature, wherein a pressure in a direct vicinity of the evaporation surface is below a vapor pressure for the surface temperature, the vapor pressure being the vapor pressure of the material.

According to an embodiment of the invention, there is provided a device manufacturing method including generating a plasma that emits extreme ultraviolet radiation; collecting the extreme ultraviolet radiation with a collector mirror; converting the extreme ultraviolet radiation into a beam of radiation; patterning the beam of radiation; projecting the beam of radiation onto a target portion of a substrate; and removing debris produced by the plasma. The removing includes maintaining an evaporation surface at a surface temperature, wherein a pressure in a direct vicinity of the surface is below a vapor pressure for the surface temperature, the vapor pressure being the vapor pressure of the debris.

BRIEF DESCRIPTION OF THE DRAWINGS

Embodiments of the present invention will flow be described, by way of example only, with reference to the accompanying schematic drawings in which corresponding reference symbols indicate corresponding parts, and in which.

DETAILED DESCRIPTION

Figure 1:
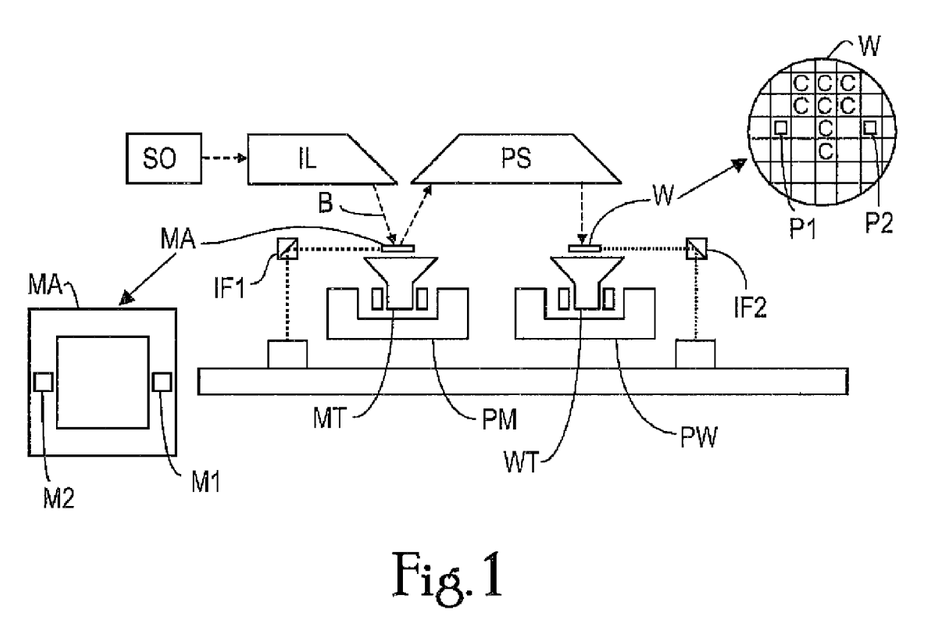
FIG. 1 schematically depicts a lithographic apparatus according to an embodiment of the invention.

FIG. 1 schematically depicts a lithographic apparatus according to an embodiment of the present invention. The apparatus includes an illumination system (illuminator) IL configured to condition a radiation beam B (e.g. UV radiation or EUV radiation). A patterning device support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PS is configured to project the patterned radiation beam B onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system.

Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type, for example employing a reflective mask. Alternatively, the apparatus may be of a transmissive type, for example employing a transmissive mask.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a delivery system (not shown in FIG. 1) including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjusting device (not shown in FIG. 1) configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser (not shown in FIG. 1). The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. After being patterned by the patterning device (e.g. mask) MA, the radiation beam B passes through the projection system PL, which focuses the beam onto a target portion C of the substrate W. With the aid of the second positioning device PW and a position sensor IF2 (e.g. an interferometric device, linear encoder or capacitive sensor), the substrate table WT can be moved accurately, e.g. so as to position different target portions C in the path of the radiation beam B. Similarly, the first positioning device PM and a position sensor IF1 (e.g. an interferometric device, linear encoder or capacitive sensor) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the patterning device pattern support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions. These are known as scribe-lane alignment marks. Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT are scanned synchronously while a pattern imparted to the radiation beam is projected onto a target portion C (i.e. a single dynamic exposure). The velocity and direction of the substrate table WT relative to the patterning device support (e.g. mask table) MT may be determined by the (de-)magnification and image reversal characteristics of the projection system PSL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the substrate table WT is moved or scanmed while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
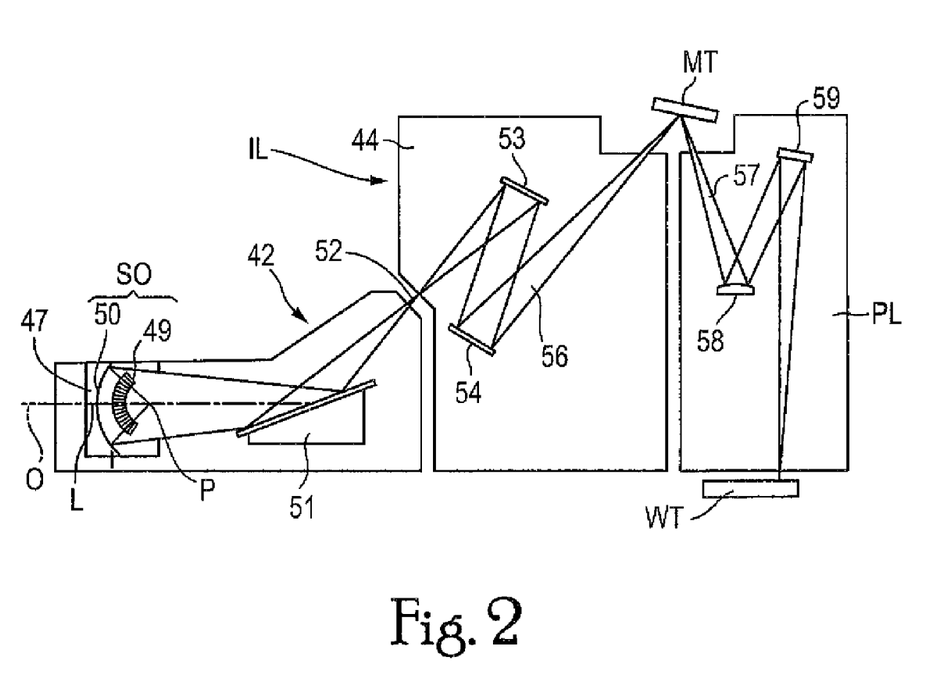
FIG. 2 schematically depicts a side view of an EUV illumination system and projection optics of a lithographic projection apparatus according to an embodiment of the invention.

FIG. 2 shows the lithographic apparatus in more detail, including a radiation system 42, an illumination optics unit 44, and a projection system PL. The radiation system 42 includes the radiation source SO. Embodiments of the source SO are depicted in FIGS. 3-6. The source SO is configured to produce extreme ultraviolet radiation which may be emitted by a plasma P. Such a plasma P may be produced by irradiating a droplet D (see FIG. 3) of a fuel material, such as tin (Sn) droplets which may be supplied by a fuel material supply SP (FIG. 3) constructed and arranged for this purpose. The radiation source SO may include a laser L, for instance a $CO_2$ laser, to irradiate the droplet D. As a consequence, a hot plasma is created, for example by causing a partially ionized plasma to collapse onto an optical axis 0. The hot plasma created emits radiation in the EUV range of the electromagnetic spectrum. This source may be referred to as a laser-produced plasma (LPP) source. The radiation source SO may comprise a source chamber 47. The source SO may also comprise a contamination trap 49 and a collector 50, however, the contamination trap 49 and collector 50 do not have to be part of the source SO. In the present example, the EUV radiation emitted by plasma P is reflected by the collector 50 to be focused to a focal point 52 via the gas barrier structure or contamination trap 49 which may be positioned in source chamber 47. The gas barrier structure/contamination trap 49 includes a channel structure such as described in detail in U.S. Pat. Nos. 6,614,505 and 6,359,969. In an embodiment, the chamber comprises hydrogen. In an embodiment, the gas in the chamber substantially only comprises hydrogen.

The embodiment illustrated in FIG. 2 includes a spectral filter 51. For example, radiation reflected by the collector 50 may be reflected off a grating spectral filter 51 to be focused in the focal point 52. Instead of a grating spectral filter, a transmissive spectral filter may be applied, configured to transmit the EUV radiation. The radiation beam 56 thus formed is reflected in illumination optics unit 44 via normal incidence reflectors 53, 54 onto a patterning device (e.g. reticle or mask) positioned on patterning device support (e.g. reticle or mask table) MT. A patterned beam 57 is formed which is imaged in projection system PL via reflective elements 58, 59 onto substrate table WT. More elements than shown may generally be present in illumination optics unit 44 and projection system PL.

The radiation collector 50 may be a collector as described in European Patent Application Publication No. EP 1394612, which is incorporated herein by reference. In other embodiments, the radiation collector is one or more collectors selected from the group of: a collector configured to focus collected radiation into the radiation beam emission aperture, a collector having a first focal point that coincides with the source and a second focal point that coincides with the radiation beam emission aperture, a normal incidence collector, a collector having a single substantially ellipsoid radiation collecting surface section, and/or a Schwarzschild collector having two radiation collecting surfaces.

In an embodiment, the radiation source SO may be a discharge-produced plasma (DPP) source.

Figure 3:
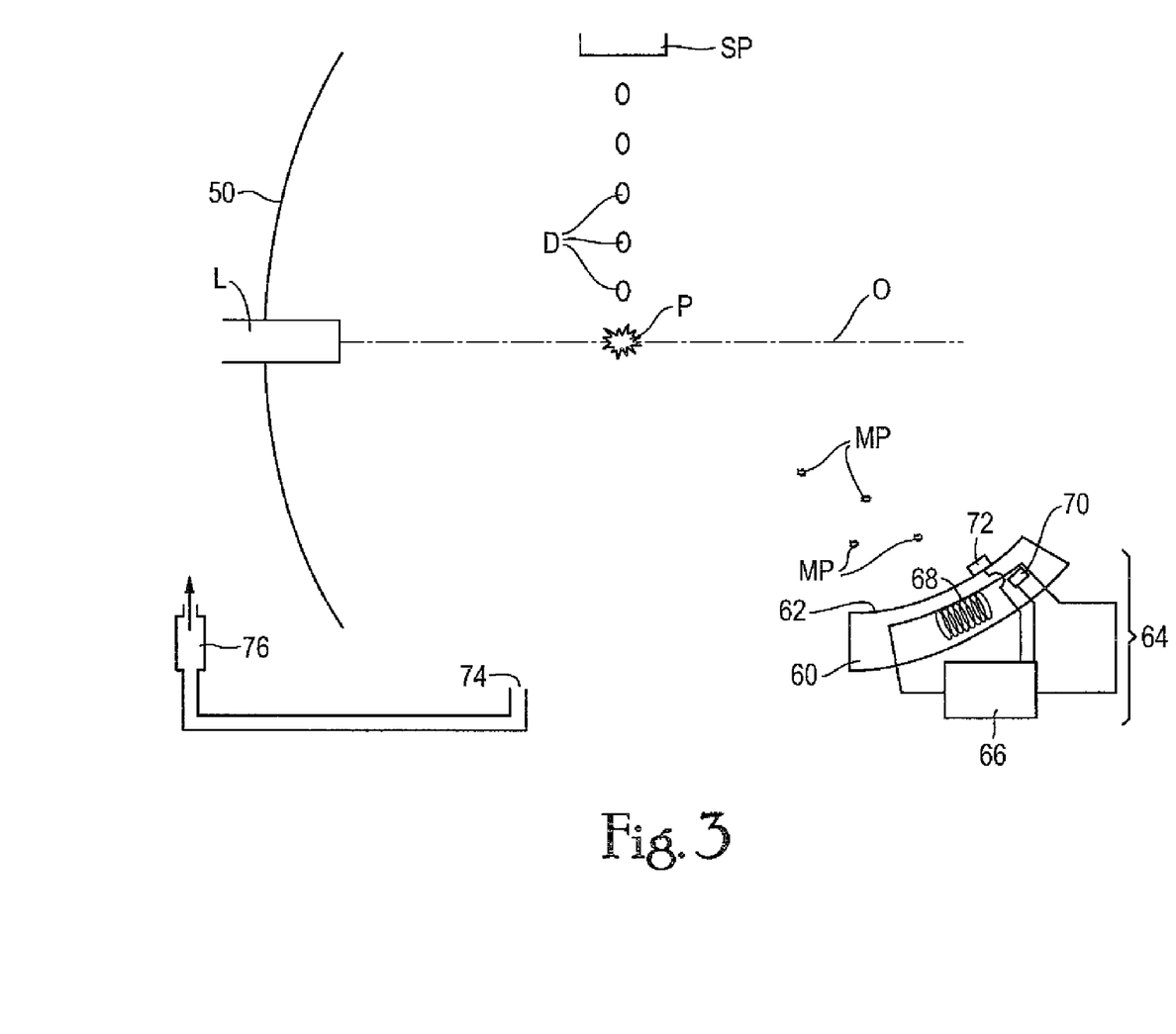
FIG. 3 depicts a radiation source of the EUV illumination system and projection optics shown in FIG. 2.

FIG. 3 depicts a more detailed view of the radiation source SO of FIG. 2. In operation, the supply SP provides droplets D, while the laser irradiates these droplets thereby forming a plasma P thus creating EUV radiation. As a by-product, the plasma P may produce debris in the form of atoms, ions or micro-particles MP. Micro-particles, although generally several orders of magnitude smaller than droplet D, are liquid material themselves and can thus be regarded as further droplets.

For example, the micro-particles (or just "particles") can have a diameter in the range of about 0.01 μm to 5 μm, for example, about 0.01 μm to about 0.1 μm. The radiation source SO of FIGS. 2 and 3 is further provided with an evaporating element 60, for example a plate 60, having an evaporation surface 62. The evaporating element can have various shapes and dimensions, and may be located in various positions and orientations. Some advantageous examples of the evaporating element 60 will be described below. For example, the surface 62 may be provided by several materials, for example molybdenum (Mo), tungsten (W), and rhenium (Re), or other materials. The evaporation surface 62 may be a substantially smooth surface, however, the surface is preferably a rough surface. For example the surface 62 can be provided with a surface enlarging structure or configuration, for example by having surface enlargement fins or a roughening structure. It is desirable that the surface 62 is provided with a particle capturing structure, for example by providing a porous surface 62, or a surface having a particle capturing mesh. Moreover, the surface 62 can be provided with a divider structure, for example having sharp edges, to split relative large incoming particles into smaller ones, before being evaporated. In this way, a very efficient particle evaporation is expected to be achieved.

The evaporation surface 62 is configured to mitigate the debris particles during operation, particularly by evaporating the particles upon impact. For example, a heating system 64 may provided, for example comprising a heating device, for example a resistor 68 or another suitable heating device, located inside the plate 60. In addition, heating system 64 may be provided with a temperature sensor 70 arranged to measure the temperature of the evaporation surface and/or a pressure sensor 72 constructed and arranged to measure a pressure in a direct vicinity of the surface. A power supply 66 can be provided, to power the heating device 68. Also, an outlet 74 is provided which is in a fluid connection with a pump 76.

In the present embodiment, heat can be supplied to the evaporating surface utilizing a heating device 68 that is located near the surface (for example by being integrated in the constructional element 60 that provides the surface 62). In an embodiment, an external heating device can be applied, for example a heat radiating device configured to transmit heat radiation to the evaporating surface, or to the element 60. For example, the surface 62 (or another part of the element 60) can be configured to substantially absorb such radiation, in order to heat up the evaporation surface 62.

Similarly, the temperature sensor can be located near the evaporating surface 62 (for example by being integrated in the constructional element 60). In an embodiment, one or more external sensors can be applied, for example a pyrometer, to detect the temperature at or near the evaporating surface 62.

In a non-limiting embodiment, the heating system may be constructed and arranged to maintain the evaporation surface 62 at a surface temperature, such that a pressure in a direct vicinity of the surface 62 is below a vapor pressure for the surface temperature, the vapor pressure being the vapor pressure of the particle material MP which, in use, is emitted by the plasma P as a by-product (towards the surface 62).

During operation, the heating system 64 may heat the element 60 such that the temperature of the evaporation surface 62 is at a temperature, wherein the pressure measured by the pressure sensor is below a vapor pressure for the evaporation surface temperature. In other words, during operation, the evaporation surface 62 is maintained at a high temperature to evaporate the inbound particles MP. In this way, a micro-particle incident on the evaporation surface may be evaporated substantially instantaneously. Subsequently, the resulting gas, resulting from the evaporation of the particle MP, is desirably diverted away from the collector chamber 47, for example by pump 76 via outlet 74.

For example, a typical Sn droplet diameter may be about 50 µm. Because the specific heat capacity and the evaporation enthalpy are known for liquid Sn, it can be calculated that about 1.5 mJ per droplet is desired to evaporate Sn. At a rate of 50,000 droplets per second, this results in a power of about 75 W.

Particles created in the plasma P will be emitted in all directions, for example by scattering in the full 4 Pi. However, more particles are typically emitted in a certain direction than in others. For example, most particles have a preferred scattering direction. This direction is determined by the superposition of forces caused by gas flow, gravitation, and a laser pointing vector (for example the laser direction and intensity). Adding this to the initial droplet momentum results in a vector indicating the direction from the plasma in which more of the material is emitted than in other directions. Desirably, the evaporation surface 62 is located in this direction when viewed from the plasma P.

Table 1 discloses several vapor pressures for certain surface temperatures, indicating that the tin (Sn) boiling temperature reduces with lower vapour pressure. The table indicates variation of the temperature of the evaporation surface 62 from about 1475 K to about 2900 K, and respective Sn Vapor pressures varying between about 1 Pa and about 100 kPa, i.e. several orders of magnitude. Suitable evaporation surface materials that can be heated to temperatures within this range are molybdenum (Mo), tungsten (W), and rhenium (Re).

TABLE 1

| | P (Pa) | | | | | |
| --- | --- | --- | --- | --- | --- | --- |
| | 1 | 10 | 100 | 1k | 10k | 100k |
| at T (K) | 1497 | 1657 | 1855 | 2107 | 2438 | 2893 |

Figure 4:
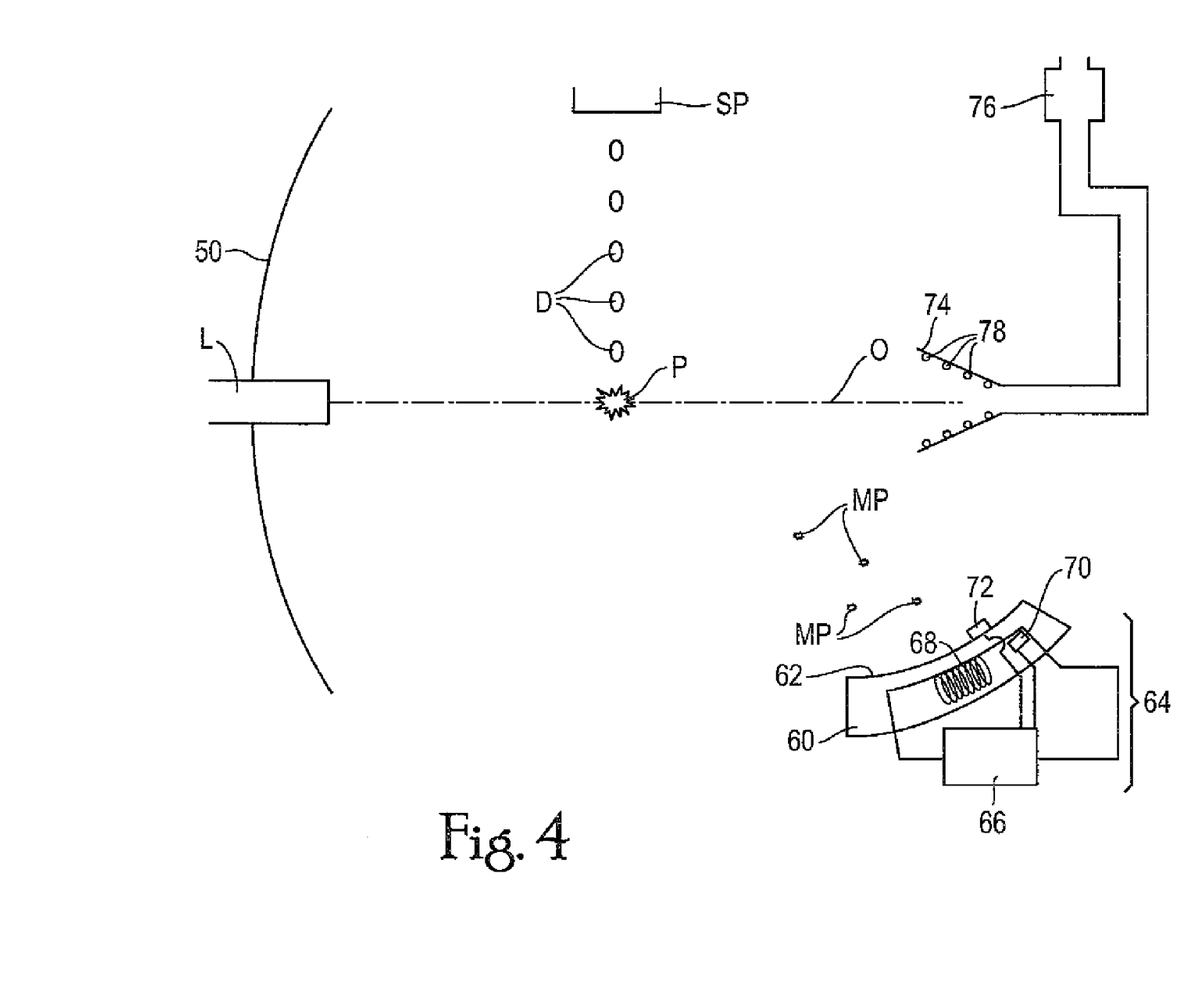
FIG. 4 depicts a modification of the radiation source of FIG. 3.

A modification of the radiation source is depicted in FIG. 4. In this modification, a cone-shaped outlet 74 is provided. In addition, one or more cooling rings 78 are provided inside the cone-shaped outlet 74, also referred to as an extraction cone. Of course, instead of a cooling ring 78; an additional or other cooling device may be provided. For instance, a cooling spiral may be provided on the inside of the cone-shaped outlet 74. Operation of the FIG. 4 embodiment includes a cooling of the gas flow flowing through the outlet 74, such, that evaporated debris (present in the gas flow) can condense. Resulting liquid debris material can be caught by the outlet 74 itself (for example by the cooling rings 78), for example to recycle the material. Also, the rings 78 can prevent liquefied debris material to flow back towards the source vessel. A device to recycle the evaporated debris particles MP can also be configured in a different manner. For example, a liquefying system to liquefy (and preferably collect) the evaporated particle material can be located upstream with respect to the outlet 74, for example between the pump 76 and the outlet 74, or in a different location.

Figure 5:
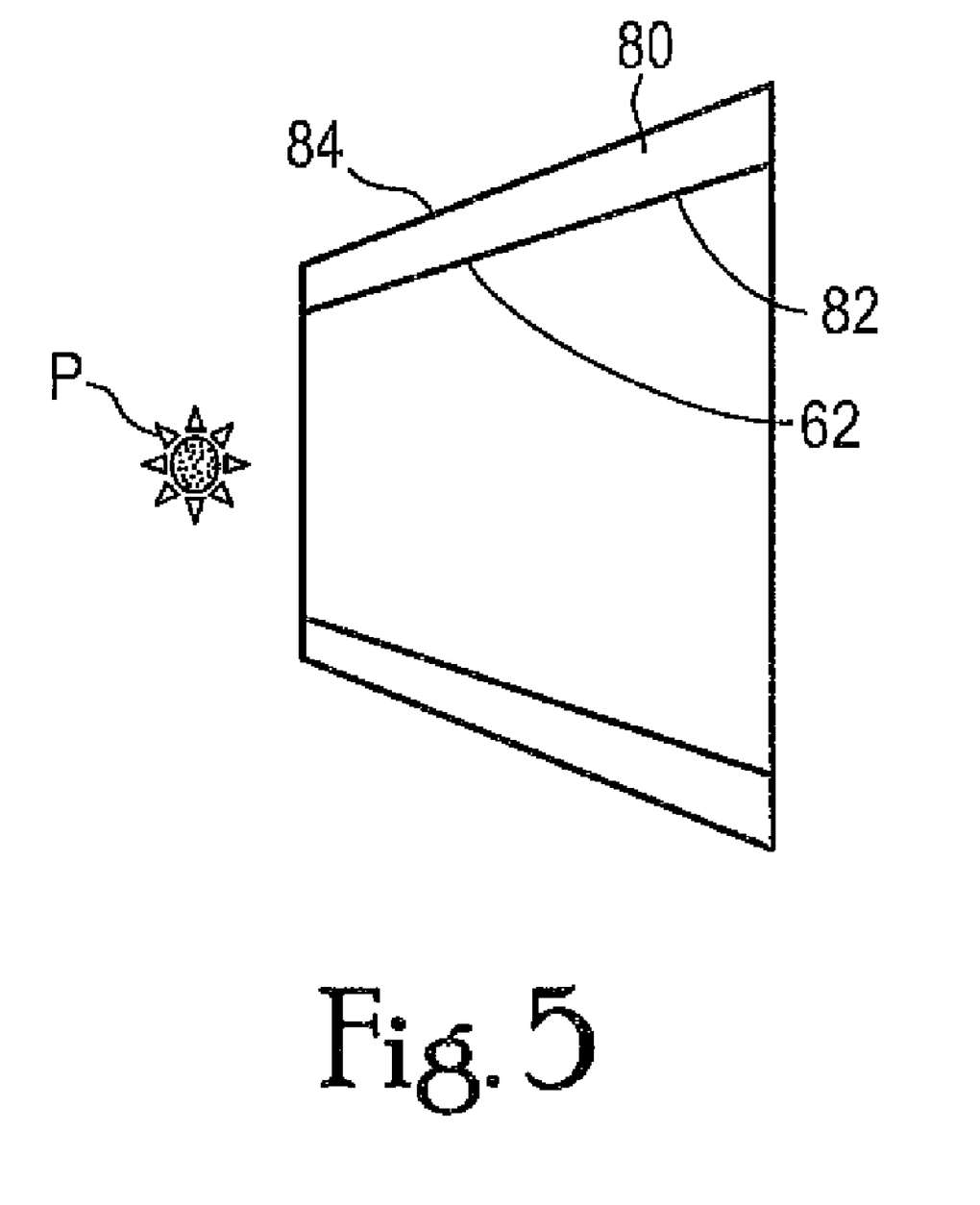
FIG. 5 depicts another modification of the radiation source.

Another modification of the radiation source is disclosed referring to FIG. 5, and desirably comprises double sided walls. Compared to the radiation source of FIGS. 3 and 4, the radiation source disclosed referring to FIG. 5 is quite similar. However, the evaporation surface 62 is provided on a conically-shaped body 80 having an inner surface 82 and an outer surface 84. For the sake of clarity, only the plasma P and the body 80 are depicted in FIG. 5. The evaporation surface 62 of the conically-shaped body is located on the inner surface 82 of the conically-shaped body 80. In order to improve a thermal property of the conically-shaped body 80, the inner surface 82 may be provided with a low-emissivity material and/or the outer surface 84 may be provided with a high-emissivity material. A well-polished metal, such as polished molybdenum (Mo) or tungsten (W), may be used as the low-emitting material. A ceramic material may be used as the high-emitting material. The outside wall 84 is preferably cooled. In this way the side wall heat transfer can be significantly limited, thus decreasing the power needed to put in (to heat the evaporation surface).

To help ensure a proper heat transfer between the evaporation surface 62 and micro-particles D that are incident on the evaporation surface 62, the evaporation surface 62 may at least partially be a rough surface. For example, the surface 62 can be made micro rough, to increase sticking and residence time of incoming debris particles. For instance, the surface 62 may have a root mean square (RMS) roughness of between about 10 nm and about 1 mm, desirably between about 50 nm and about 10 µm. For example, the surface can be both macro and micro rough. The rough surface can increase sticking and residence time significantly.

In an embodiment, the evaporation surface 62 may be a surface of the gas barrier structure/contamination trap 49. In an embodiment, the conically-shaped body 80 with the evaporation surface 62 may be part of the gas barrier structure/contamination trap 49.

In an embodiment, hydrogen radicals may be generated and provided at a location proximate a surface (e.g., a surface of the plate 60, a surface of a collector mirror) such that the hydrogen radicals react with debris deposited on the surface.

Figure 6:
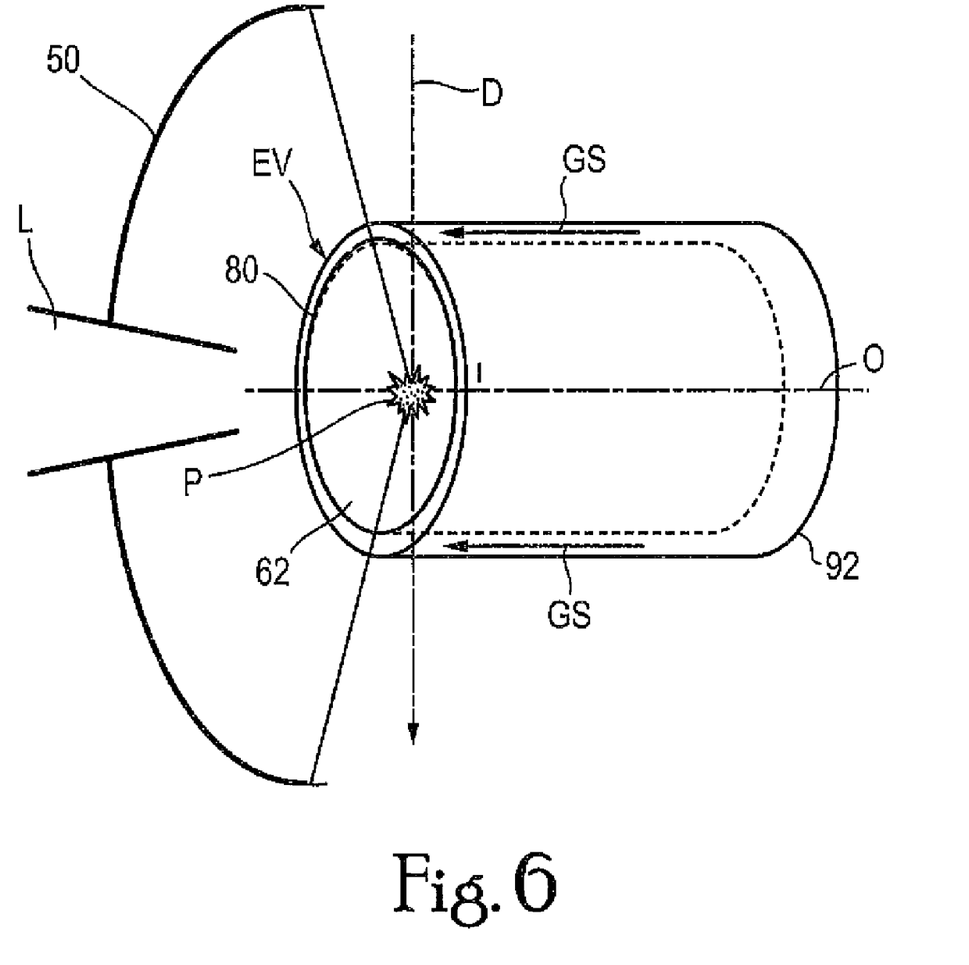
FIG. 6 schematically depicts another non-limiting embodiment of the radiation source according to an aspect of the invention.

FIG. 6 depicts another example of the radiation source. Compared to the radiation source of FIGS. 3 and 4, the radiation source disclosed referring to FIG. 6 is, again, quite similar. The embodiment according to FIG. 6 provides reduced reflection of particles, especially on the edges EV of the vaporizer, located near a plasma creation region (see drawing). Particularly, the FIG. 6 embodiment can reduce chances that particles scattered on these locations are stopped by a regular buffer gas flow, and may prevent such particles from reaching the collector.

The source may be provided with a gas injector arranged to inject a gas flow into the source chamber at an edge EV of the evaporation surface 62. The gas injector can be arranged in various ways. For example, in an embodiment, the injector is configured to feed gas along an outer surface of the debris particle vaporizer element 80, towards and along a proximal (in this case circular) edge of that element 80. For example, the gas injector can be configured to inject a ring-shaped gas curtain, into the source chamber.

In an embodiment, a pump may be provided (not shown in FIG. 6) to remove evaporated particles from the interior of the vaporizer 80; a respective pumping flow (towards the pump, and away from the collector 50) is indicated by arrows PD in FIG. 6. In the present embodiment, the pumping flow PD draws the gas curtain, injected by the injector, inwardly, towards the plasma P and into the vaporizer, to be exhausted via the vaporizer towards the pump. Thus, the gas curtain can substantially enclose the proximal edge EV of the vaporizer element 80, to shield the edge from the opposite collector's surface. Besides, debris captured and/or decelerated by the gas curtain, can be pumped away as well (via the vaporizer interior).

For example, the gas injector can include a secondary element 92, extending around a debris particle vaporizer element (for example cone) 80. With this secondary element 92, backfill gas can be supplied to the edge region where the particles have a relatively high scattering chance. A respective gas flow of the backfill gas is indicated by arrows GS in FIG. 6. The gas is desirably an inert gas with a high mass (comparable to tin), e.g. Argon, Krypton, Xenon. Desirably, the injector is configured to supply the case to all parts of the edge EV, for example in the form of a gas curtain.

Collisions of the backfill gas atoms with a debris particle which, in use, is emitted to that surface from the plasma, will lead to a higher energy transfer and thus to a more efficient mitigation of the debris. By injecting the gas locally, gas flow can be inserted directly at/along the critical edge region of the vaporizer, and does not have to cross the distance from gas cone to tin vaporizer, or from collector to tin vaporizer. Also, a relatively little amount of gas is required, and it is present only where needed. A relatively low partial pressure of gas is required leading to little absorption of EUV light. The cone can be designed such that it does not block EUV light. Also, in the present embodiment, a relatively large amount of the gas will be removed by a (relative) enormous flow of buffer gas flowing through the same region.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention is not limited to application of the lithographic apparatus or use in the lithographic apparatus as described in the embodiments. Further, the drawings usually only include the elements and features that are necessary to understand the invention. Beyond that, the drawings of the lithographic apparatus are schematic and not to scale. The invention is not limited to those elements, shown in the schematic drawings (e.g. the number of mirrors drawn in the schematic drawings). Further, the invention is not confined to the lithographic apparatus described in FIGS. 1 and 2. The person skilled in the art will understand that embodiments described above may be combined. Further, the invention is not limited to protection against, for example, Sn from a source SO, but also additional or alternatives particles from other sources.

What is claimed is:

1. A radiation source configured to produce extreme ultraviolet radiation, the radiation source comprising:
   a chamber in which, in use, a plasma is generated;
   a collector mirror configured to focus radiation emitted by the plasma to a focal point; and
   a heating system and an evaporation surface, the heating system comprising a pressure sensor configured to measure pressure in the direct vicinity of the evaporation surface and the heating system constructed and arranged to maintain the evaporation surface at a surface temperature based on the measured pressure, such that a pressure in a direct vicinity of the evaporation surface is below a vapor pressure for the surface temperature, the vapor pressure being the vapor pressure of a material which, in use, is emitted by the plasma as a by-product.

2. The radiation source according to claim 1, wherein the collector mirror is the first optical element in an optical path of the radiation emitted by the plasma.

3. The radiation source according to claim 1, wherein the heating system comprises a temperature sensor configured to measure the temperature on the evaporation surface.

4. The radiation source according to claim 3, wherein the heating system is configured to heat the evaporation surface when the pressure measured by the pressure sensor is below the vapor pressure at the temperature measured by the temperature sensor.

5. The radiation source according to claim 1, wherein the surface comprises one or more materials selected from the group consisting of Mo, W, and Re.

6. The radiation source according to claim 1, further comprising an at least partially conically-shaped body, the at least partially conically-shaped body comprising the evaporation surface.

7. The radiation source according to claim 1, wherein the temperature of the evaporation surface is in the range of about 1475 K to about 2900 K.

8. A lithographic apparatus comprising:
   a radiation source configured to produce extreme ultraviolet radiation, the radiation source comprising
   a chamber in which, in use, a plasma is generated,
      a collector mirror configured to focus radiation emitted by the plasma to a focal point, and
      a heating system and an evaporation surface, the heating system comprising a pressure sensor configured to measure pressure in the direct vicinity of the evaporation surface and the heating system constructed and arranged to maintain the evaporation surface at a surface temperature based on the measured pressure, such that a pressure in a direct vicinity of the evaporation surface is below a vapor pressure for the surface temperature, the vapor pressure being the vapor pressure of a material which, in use, is emitted by the plasma as a by-product;

a support configured to support a patterning device, the patterning device being configured to pattern the extreme ultraviolet radiation into a patterned beam of radiation; and a projection system configured to project the patterned beam of radiation onto a substrate.

9. A radiation source configured to produce extreme ultraviolet radiation, the radiation source comprising:

a chamber in which, in use, a plasma is generated; and an evaporation surface configured to evaporate a material formed as a by-product from the plasma and that is emitted to the evaporation surface, the evaporation surface having a RMS roughness of between about 10 nm and about 1 mm, or being porous, or having a plurality of protrusions thereon or therein.

10. The radiation source according to claim 9, wherein the evaporation surface is configured to be heated to a surface temperature, such that a pressure in a direct vicinity of the evaporation surface is below a vapor pressure for the surface temperature, the vapor pressure being the vapor pressure of the material.

11. The radiation source according to claim 9, further comprising a pressure sensor configured to measure the pressure in a direct vicinity of the evaporation surface.

12. The radiation source according to claim 9, further comprising a temperature sensor configured to measure the temperature on the evaporation surface.

13. The radiation source according to claim 12, further comprising a pressure sensor configured to measure pressure in a direct vicinity of the evaporation surface, the radiation source further comprising a heating system configured to heat the evaporation surface when the pressure measured by the pressure sensor is below the vapor pressure at the temperature measured by the temperature sensor.

14. The radiation source according to claim 9, wherein the surface comprises one or more materials selected from the group consisting of Mo, W, and Re.

15. The radiation source according to claim 9, further comprising an at least partially conically-shaped body, the at least partially conically-shaped body comprising the evaporation surface.

16. The radiation source according to claim 9, wherein the temperature of the evaporation surface is in the range of about 1475 K to about 2900 K.

17. A lithographic apparatus comprising:

a radiation source configured to produce extreme ultraviolet radiation, the radiation source comprising
a chamber in which, in use, a plasma is generated, and
an evaporation surface configured to evaporate a material formed as a by-product from the plasma and that is emitted to the evaporation surface, the evaporation surface having a RMS roughness of between about 10 nm and about 1 mm, or being porous, or having a plurality of protrusions thereon or therein;

a support configured to support a patterning device, the patterning device being configured to pattern the extreme ultraviolet radiation into a patterned beam of radiation; and a projection system configured to project the patterned beam of radiation onto a substrate.

18. A method for removing a material emitted as a by-product in or by a plasma radiation source, the method comprising:

maintaining an evaporation surface at a surface temperature, wherein a pressure in a direct vicinity of the surface is below a vapor pressure for the surface temperature, the vapor pressure being the vapor pressure of the material; and measuring pressure in the direct vicinity of the evaporation surface; and controlling the surface temperature based on the measured pressure.

19. A method for removing a by-product material in or from a plasma radiation source of a lithographic apparatus, the method comprising:

using a heating system and an evaporation surface, the heating system being constructed and arranged to maintain the evaporation surface at a surface temperature, wherein a pressure in a direct vicinity of the surface is below a vapor pressure for the surface temperature, the vapor pressure being the vapor pressure of the by-product material, and wherein the evaporation surface has a RMS roughness of between about 10 nm and about 1 mm, or is porous, or has a plurality of protrusions thereon or therein.

20. The method of claim 18, wherein the evaporation surface has a RMS roughness of between about 10 nm and about 1 mm, or is porous, or has a plurality of protrusions thereon or therein.

* * * * *